United States Patent
Cecil et al.

(10) Patent No.: US 11,720,015 B2
(45) Date of Patent: Aug. 8, 2023

(54) MASK SYNTHESIS USING DESIGN GUIDED OFFSETS

(71) Applicant: Synopsys, Inc., Mountain View, CA (US)

(72) Inventors: Thomas Cecil, Menlo Park, CA (US); Kevin Hooker, Austin, TX (US)

(73) Assignee: Synopsys, Inc., Sunnyvale, CA (US)

( * ) Notice: Subject to any disclaimer, the term of this patent is extended or adjusted under 35 U.S.C. 154(b) by 209 days.

(21) Appl. No.: 17/359,176

(22) Filed: Jun. 25, 2021

(65) Prior Publication Data

US 2021/0405522 A1    Dec. 30, 2021

Related U.S. Application Data

(60) Provisional application No. 63/045,639, filed on Jun. 29, 2020.

(51) Int. Cl.
| | | |
|---|---|---|
| *G03F 1/70* | (2012.01) | |
| *G06T 7/536* | (2017.01) | |
| *G03F 1/36* | (2012.01) | |

(52) U.S. Cl.
CPC ............. *G03F 1/70* (2013.01); *G03F 1/36* (2013.01); *G06T 7/536* (2017.01); *G06T 2207/10028* (2013.01); *G06T 2207/30148* (2013.01)

(58) Field of Classification Search
CPC ... G03F 1/70; G03F 1/36; G06T 7/536; G06T 2207/10028; G06T 2207/30148; G06T 11/203; G06F 30/33
See application file for complete search history.

(56) References Cited

U.S. PATENT DOCUMENTS

| | | | | |
|---|---|---|---|---|
| 7,865,865 B2* | 1/2011 | Socha | ................. | G03F 1/26 430/5 |
| 2008/0092106 A1* | 4/2008 | Hsu | ................. | G03F 7/70433 716/55 |
| 2008/0184191 A1* | 7/2008 | Socha | ................. | G03F 1/26 716/55 |
| 2009/0125866 A1* | 5/2009 | Wang | ................. | G03F 1/70 716/50 |
| 2018/0341740 A1 | 11/2018 | Cecil | | |
| 2021/0064977 A1* | 3/2021 | Cecil | ................. | G06F 30/27 |

FOREIGN PATENT DOCUMENTS

EP    1925978 A2 *    5/2008   ............. G03F 1/26

* cited by examiner

*Primary Examiner* — Stacy Whitmore
(74) *Attorney, Agent, or Firm* — Patterson + Sheridan, LLP

(57) ABSTRACT

Aspects described herein relate to mask synthesis using design guided offsets. A target shape on an image surface to be fabricated using a mask based on a design of an integrated circuit is obtained. Rays are generated emanating from respective anchor points. The anchor points are on a boundary of the target shape or a boundary of a mask shape of the mask. For each ray of the rays, a distance is defined between a first intersection of the respective ray and the boundary of the target shape and a second intersection of the respective ray and the boundary of the mask shape. An analysis is performed by one or more processors, where the analysis is configured to modify the distances based on an error between the target shape and a resulting shape simulated to be on the image surface resulting from the mask shape.

20 Claims, 8 Drawing Sheets

MASK SYNTHESIS USING DESIGN GUIDED OFFSETS

CROSS-REFERENCE TO RELATED APPLICATION

The present disclosure claims priority to U.S. Provisional Application No. 63/045,639 filed Jun. 29, 2020, which is hereby expressly incorporated by reference herein in its entirety as if fully set forth below and for all applicable purposes.

TECHNICAL FIELD

The present disclosure relates to mask synthesis from a design of an integrated circuit, and more particularly, to mask synthesis using design guided offsets.

BACKGROUND

As mask complexity has increased in recent years, there has been a move towards the ability to synthesize and manufacture curvilinear masks as opposed to the traditional rectilinear mask shapes. These curvilinear mask shapes have imposed new demands on the geometric processing algorithms within the mask synthesis flow, as the mask optimization steps require the evolution of more complicated shapes.

SUMMARY

Some aspects of the present disclosure are directed to a method for circuit design. The method generally includes: obtaining a target shape on an image surface to be fabricated using a mask based on a design of an integrated circuit; generating rays emanating from respective anchor points, the anchor points being on a boundary of the target shape or a boundary of a mask shape of the mask; defining, for each ray of the rays, a distance between a first intersection of the respective ray and the boundary of the target shape and a second intersection of the respective ray and the boundary of the mask shape; modifying, by one or more processors, the distance based on an error between the target shape and a resulting shape simulated to be on the image surface resulting from the mask shape; and generating a mask design for the mask that is to be used to fabricate the target shape on the image surface based on the modified distance.

Some aspects of the present disclosure are directed to an apparatus for circuit design. The apparatus generally includes a memory, and one or more processors coupled to the memory. The memory and the one or more processors are configured to: obtain a target shape on an image surface to be fabricated using a mask based on a design of an integrated circuit; generate rays emanating from respective anchor points, the anchor points being on a boundary of the target shape or a boundary of a mask shape of the mask; define, for each ray of the rays, a distance between a first intersection of the respective ray and the boundary of the target shape and a second intersection of the respective ray and the boundary of the mask shape; and perform an analysis, by one or more processors, configured to modify the distance based on an error between the target shape and a resulting shape simulated to be on the image surface resulting from the mask shape.

Some aspects of the present disclosure are directed to a non-transitory computer-readable medium comprising executable instructions that, when executed by one or more processors of an apparatus, cause the apparatus to: obtain a target shape on an image surface to be fabricated using a mask based on a design of an integrated circuit; generate rays emanating from respective anchor points, the anchor points being on a boundary of the target shape or a boundary of a mask shape of the mask; define, for each ray of the rays, a distance between a first intersection of the respective ray and the boundary of the target shape and a second intersection of the respective ray and the boundary of the mask shape; and perform an analysis, by one or more processors, configured to modify the distance based on an error between the target shape and a resulting shape simulated to be on the image surface resulting from the mask shape.

Other aspects provide: an apparatus operable, configured, or otherwise adapted to perform the aforementioned methods as well as those described elsewhere herein; a non-transitory, computer-readable media having instructions that, when executed by one or more processors of an apparatus, cause the apparatus to perform the aforementioned methods as well as those described elsewhere herein; a computer program product embodied on a computer-readable storage medium including code for performing the aforementioned methods as well as those described elsewhere herein; and an apparatus having means for performing the aforementioned methods as well as those described elsewhere herein. By way of example, an apparatus may include a processing system, a device with a processing system, or processing systems cooperating over one or more networks.

The following description and the appended figures set forth certain features for purposes of illustration.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

DETAILED DESCRIPTION

Figure 1:
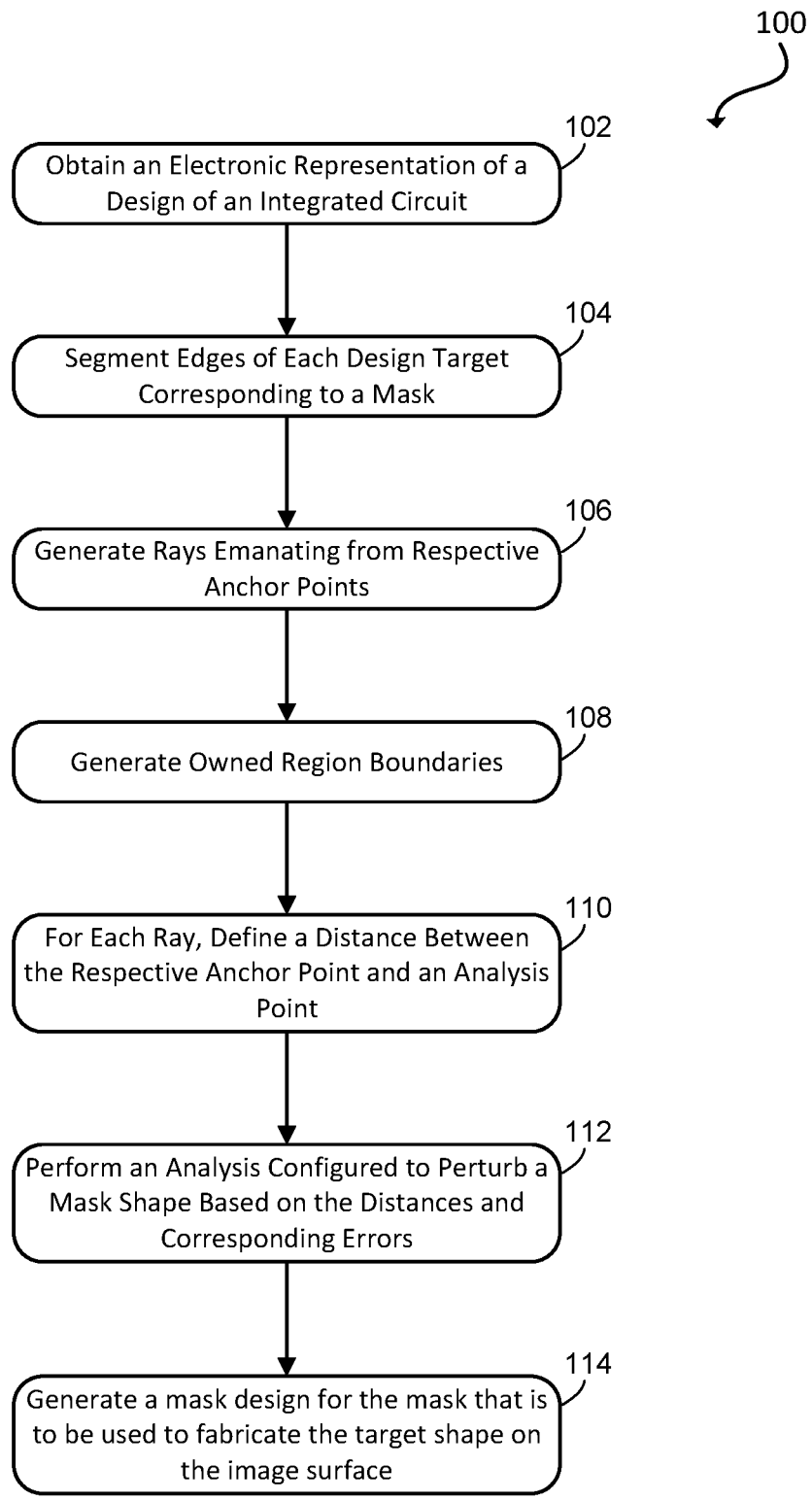
FIG. 1 is a flowchart of a method for mask synthesis using design guided offsets according to some examples of the present disclosure.

Aspects described herein relate to mask synthesis using design guided offsets. This disclosure describes a way of tracking the mask evolution, which generalizes the more typical optical proximity correction (OPC) techniques which offset segments from the given wafer design target/goal. Optical proximity correction (OPC) is a photolithography enhancement technique used to compensate for image errors due to diffraction or process effects. In some aspects, a data structure of rays emanating from anchor points (e.g., edges and corners of a design target) is used, and for each ray, a distance between an intersection of the ray and a boundary of the mask shape and an intersection of the ray and a boundary of the design target is tracked. Using these distances, a method is introduced that has the benefit of correspondence between the design target and mask locations without using the same edge orientation of the mask and design edges, thus allowing for curvilinear solutions which can obtain better lithographic quality of results (QOR).

Various methodologies for curvilinear mask evolution may involve using pixel based methods such as level sets, etc. These are more computationally intensive than the aspects of the present disclosure and can suffer from shift variance related inconsistencies. Other methodologies may include free-form point tracking methods for points on polygon edges. These are computationally difficult, have difficulty with point crossings that create illegal or ill-defined shapes, and may lose the connectivity between the mask and design edges which is a desired feature for typical OPC operations.

The methods used for typical OPC mask shape tracking are used across multiple mask synthesis applications including but not limited to rule-based OPC, model-based OPC, rule-based retargeting, and model-based etch retargeting correction. Curvilinear versions of these applications can be implemented using the method described in the present disclosure.

For rule-based OPC, the methodology is to construct a series of geometric rules that can determine the modifications of the design which result in a mask. For example, geometric quantities, such as pattern density, polygon edge lengths, distances of subsections of edge to a corner vertex, etc, can be measured. A rule table or function is constructed that can take as input these various geometric quantities and can output amounts by which the design should be locally modified. The modification can be specified by prescribing an edge or sub-edge perturbation in the normal direction to the polygon boundary, or other geometric manipulations. Various aspects may be used as an algorithm that does polygon manipulation to create a rule-based, curvilinear mask polygon.

For model based OPC, the mask creation is similar to the rule-based OPC case except that the method for deciding the polygon manipulation amounts is determined by model simulation feedback, such as wafer targeting errors or other wafer level image signatures. Various aspects may be used as an algorithm to manipulate a given input polygon to create a corrected mask polygon. Often model-based OPC will have an iterative procedure that can re-correct the same polygon given further model-based feedback from a previous iteration of the polygon movement.

Rule-based retargeting methods are similar to rule-based OPC except that the output polygon shapes are used as an input wafer target for subsequent lithographic correction algorithms, e.g. OPC or inverse lithography technology (ILT). Thus, the content of the rule table or function can have a different goal, but the procedure of determining geometric measurements, assigning geometric changes to the various parts of the design, and modifying the design is similar to rule based OPC.

Likewise, etch models are often used to modify the design target to produce a wafer target for lithographic correction algorithms, e.g. OPC or ILT. Various embodiments may be used as an algorithm to manipulate the input design target to produce the wafer target.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Also, various terms are used herein as used in the art. For example, "optimization", "optimize", and "optimizing" refer, as used in the art and as understood by a person having ordinary skill in the art, to a mathematical formulation of a problem to select some improvement (if an improvement is available), within the structure of the algorithm implemented, of some identified characteristic, and do not imply an absolute or global optimal (as the term is more colloquially used) improvement of the characteristic. For example, in some situations where optimizing may determine a minimum, the minimum may be a local minima rather than the global minimum.

FIG. 1 is a flowchart of a method 100 for mask synthesis using design guided offsets according to some examples. The method 100 is described below in the context of various figures, particularly FIG. 2, to illustrate aspects. These figures are provided merely as examples, and a person having ordinary skill in the art will readily understand application of the method 100 in other examples. Various figures, and particularly FIG. 2, may show portions or less than all of certain types of components illustrated within the respective figure. This is to avoid obscuring various aspects that are illustrated. A person having ordinary skill in the art will readily understand how to apply what is illustrated and described throughout an implementation.

As described in further detail below, the method 100 can be embodied by one or more sets of instructions, which may be one or more software modules, stored on a non-transitory computer readable medium. One or more processors of a computer system can be configured to read and execute the one or more sets of instructions, which causes the one or more processors to perform the various operations or steps of the method 100. Further details are provided below. In some examples, some operations or steps of the method 100 can be embodied as one or more sets of instructions as one or more software modules, and other operations or steps of the method 100 can be embodied as one or more other sets of instructions as one or more other software modules. The different software modules can be distributed and stored on different non-transitory computer readable media on different computer systems for execution by respective one or more processors of the different computer systems in some examples.

Figure 2:
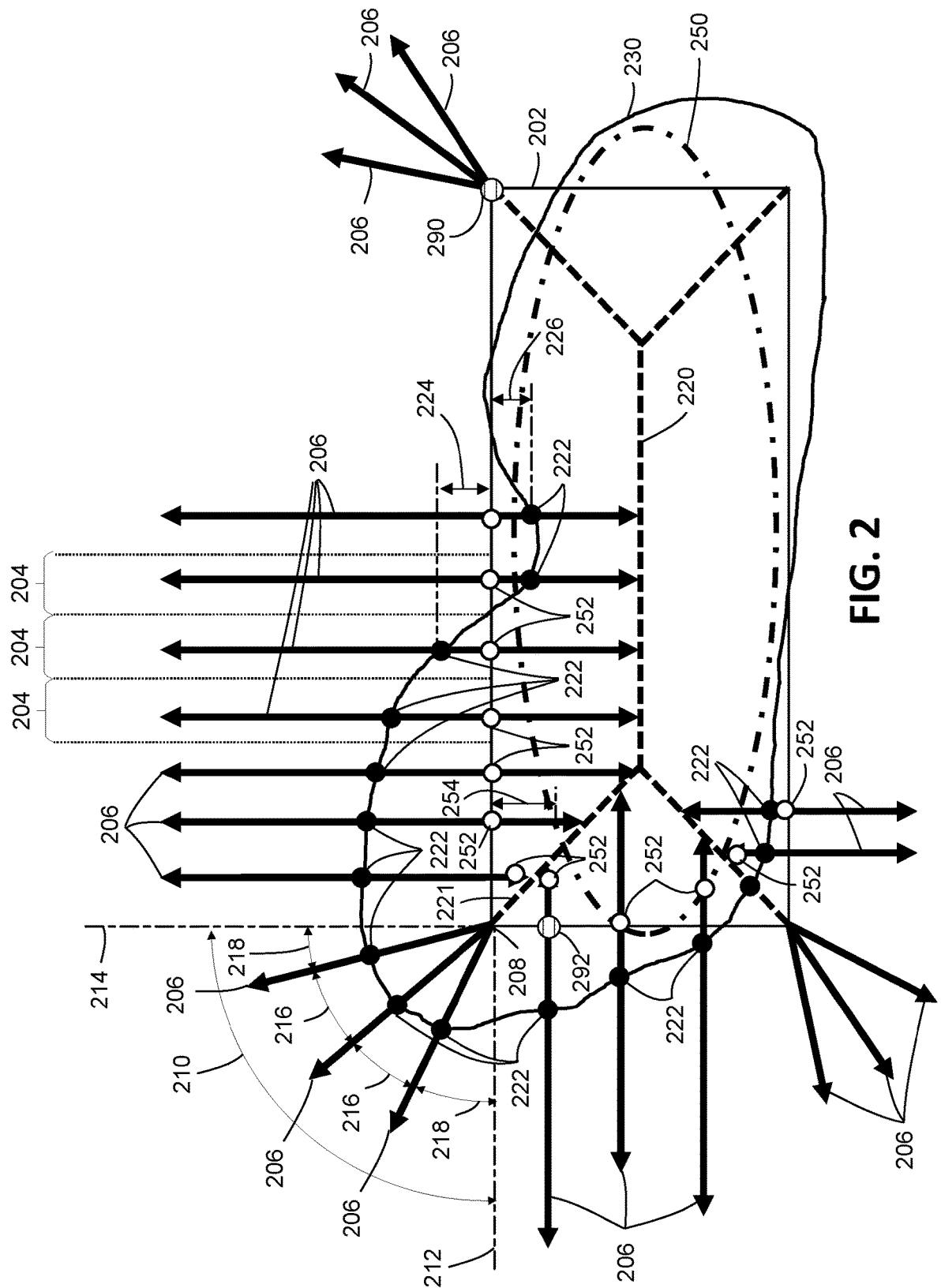
FIG. 2 depicts a layout to illustrate aspects of the method for mask synthesis of FIG. 1 according to some examples of the present disclosure.

Referring to FIG. 1, at 102, an electronic representation of a design of an integrated circuit is obtained. The electronic representation can be, for example, a .GDS file or the like. The design of the integrated circuit can include or indicate design target features (or design targets) that are to be patterned by a lithography process in a photosensitive material (e.g., photoresist) during fabrication of the integrated circuit on a semiconductor die (e.g., while part of a wafer). The design targets can be used to form a mask that is used during the lithography process. FIG. 2 depicts a polygon of a design target 202 (e.g., a feature to be printed in a photosensitive material) as an example.

Referring to FIG. 1, at 104, edges of each design target corresponding to a mask is segmented. Referring to FIG. 2, segments 204 are along an edge of the design target 202 and represent a segmentation of the design. Segmentation of one or more design targets may be a first step for an OPC solution where the granularity of the lithography targeting points on the wafer, as well as the mask coarseness, is specified. Three segments 204 are shown for brevity, and a number of like segments are throughout the edges of the design target 202. A method for determining segments 204 along a polygon edge for OPC is to use a rule or model based function, which gathers geometric measurement or lithograph simulation feedback, respectively, and determines where along a design polygon edge segment endpoints should be placed so as to break the design edge into a sequence of end to end segments. The input to this function is similar to the input described above about rule based and model based OPC methods.

Referring back to FIG. 1, at 106, rays emanating from respective anchor points are generated. The anchor points can vary depending on implementation. In examples implementing mask evolution, the anchor points can be along edges and corners of the design target 202. In examples implementing retargeting, the anchor points can be along edges, and if present, corners of a mask shape corresponding to the design target. In such retargeting implementations, the mask shape can be initialized corresponding to the design target, e.g., by perturbing edges of the design target laterally outward some amount.

FIG. 2 is described in the context where anchor points are along the edges and corners of the design target 202. The concepts described herein may be modified to apply to retargeting implementations. Rays 206 are illustrated in FIG. 2. Each ray 206 in FIG. 2 emanates from an anchor point on an edge or an exterior convex corner formed by edges of the design target 202. In the example of FIG. 2, one or more rays can emanate from an anchor point (e.g., anchor point 290) on a concave corner of the polygon of the design target 202 on an interior side of the polygon. A ray 206 emanating from an anchor point (e.g., anchor point 292) on an edge emanates in a direction normal to the respective edge of the design target 202. In some examples, each segment 204 along an edge of the design target 202 has one or more rays 206 emanating from a respective anchor point on the respective segment 204.

In some examples, each corner of the polygon of the design target 202, whether convex or concave, can be an anchor point and can have one or more rays 206 emanating therefrom. Example corner 208 is illustrated in FIG. 2 and aspects of this corner 208 are described herein for illustration. Description provided for the corner 208 also applies to other corners, whether convex or concave. An angle span 210 is at the corner 208 and is formed between the respective directions 212, 214 that extend from the corner 208 and that are normal to the two segments that meet forming the corner 208. The rays 206 emanating from an anchor point on the corner 208 emanate in respective directions that form equal angles 216 between each neighboring pair of rays 206 emanating from the corner 208. Angles 218 are formed between a respective normal direction 212, 214 and a corresponding most proximate ray 206 emanating from the corner 208. In some examples, each of the angles 218 may be half the angle 216 or may be equal to the angle 216.

A polygon orientation such as point order in a counterclockwise direction around the exterior of the polygon of the design target 202 can be chosen so that it can be decided if a particular corner of the design target 202 should have rays extending on the outside of the polygon (at convex corners) or on the inside (at concave corners) by examining the normal directions of the edges which meet at the corner. A finite number of angles is chosen to create the rays fanning out over the angle span.

Referring to FIG. 1, at 108, owned region boundaries are generated. An owned region boundary is formed in the design target 202. In some aspects, one or more other owned region boundaries are formed in a space between the design target and another one or more design targets, as described in more detail herein with respect to FIG. 8. Each owned region boundary can be a medial axis transform (MAT) of the design target or space between design targets for which the owned region boundary is generated.

Figure 8:
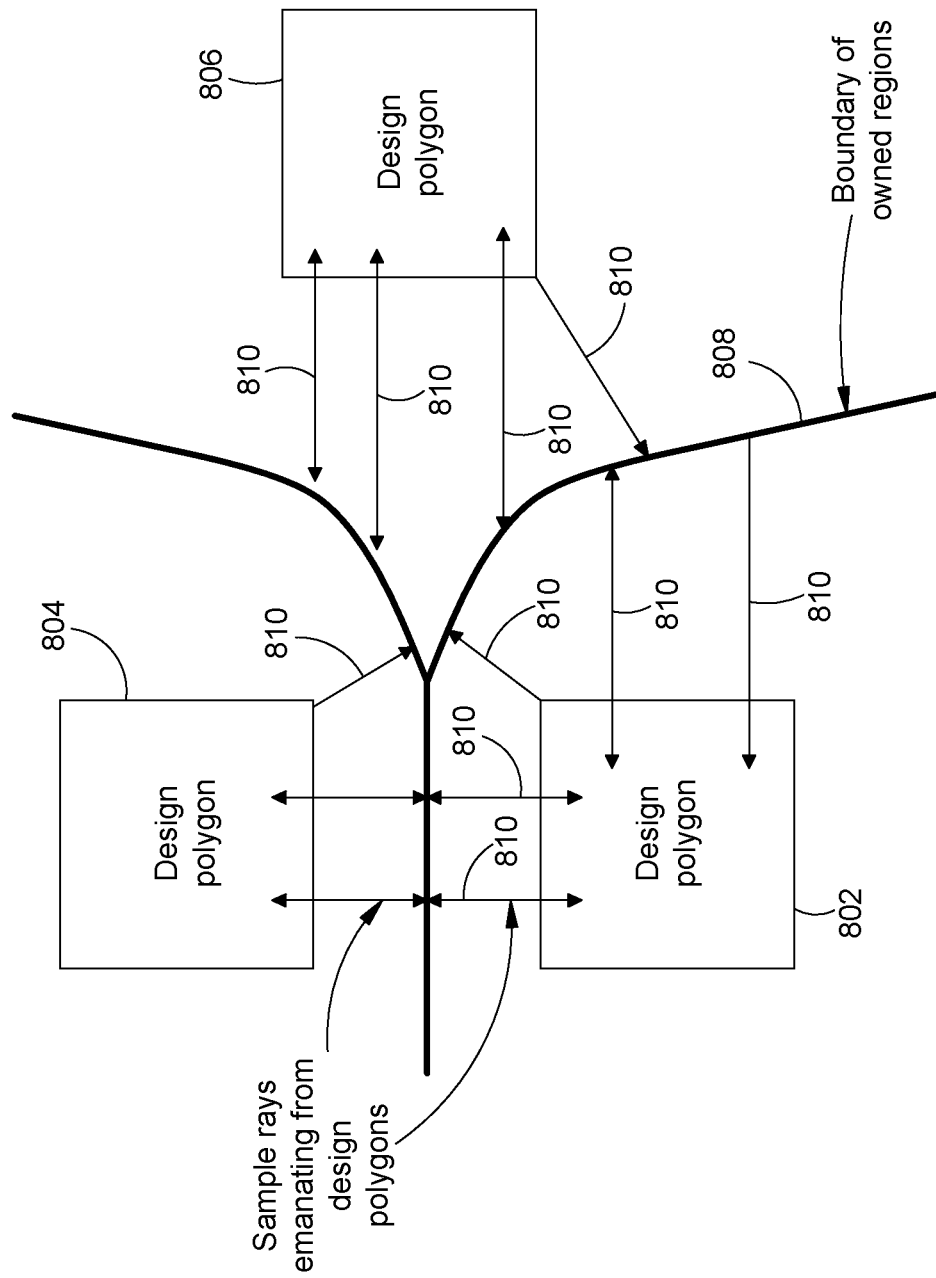
FIG. 8 illustrates owned region boundaries formed in a space between a design target and another other design targets.

Referring to FIG. 2, an owned region boundary 220 is formed in the design target 202. The owned region boundary 220 (and any other owned region boundaries) is used to indicate which areas are permitted to be reached by the rays 206, e.g., the owned region boundary 220 (and any other owned region boundaries) can act as a constraint on where the rays 206 extend. In the illustrated examples, rays 206 emanating from anchor points on segments 204 extend exterior and interior to the polygon of the design target 202, and the rays 206 emanating from the segments 204 that extend interior to the polygon cannot cross the owned region boundary 220. In some examples, spaces between neighboring features may also have owned region boundaries that rays 206 cannot cross, as shown in FIG. 8.

In some examples, for each corner of the design target 202, an axis of the owned region boundary of the design target that touches the respective corner is used as to determine a direction of a generalized ray extending outside of the design target when the respective corner is a concave corner or inside of the design target when the respective corner is a convex corner. A generalized ray emanates from a corner along the axis of the owned region boundary that touches the corner. The generalized ray for a respective corner can be used as a corresponding ray for each of the rays emanating from the respective corner that extends in a generalized direction opposite from those rays. Such a generalized ray can be used when any ray emanating from the corner degenerates, as described below. Referring to FIG. 2, as an example for a convex corner, axis 221 of the owned region boundary 220 touches the corner 208, and a generalized ray (not explicitly shown) extends from the corner 208 interior to the design target 202 and along the axis 221. This generalized ray can be used as a corresponding generalized ray for each ray 206 shown within the angle span 210. For purposes of subsequent description, the generalized ray can be considered as part of each ray emanating from the respective corner, albeit extending in a generally opposite direction.

Figure 3:
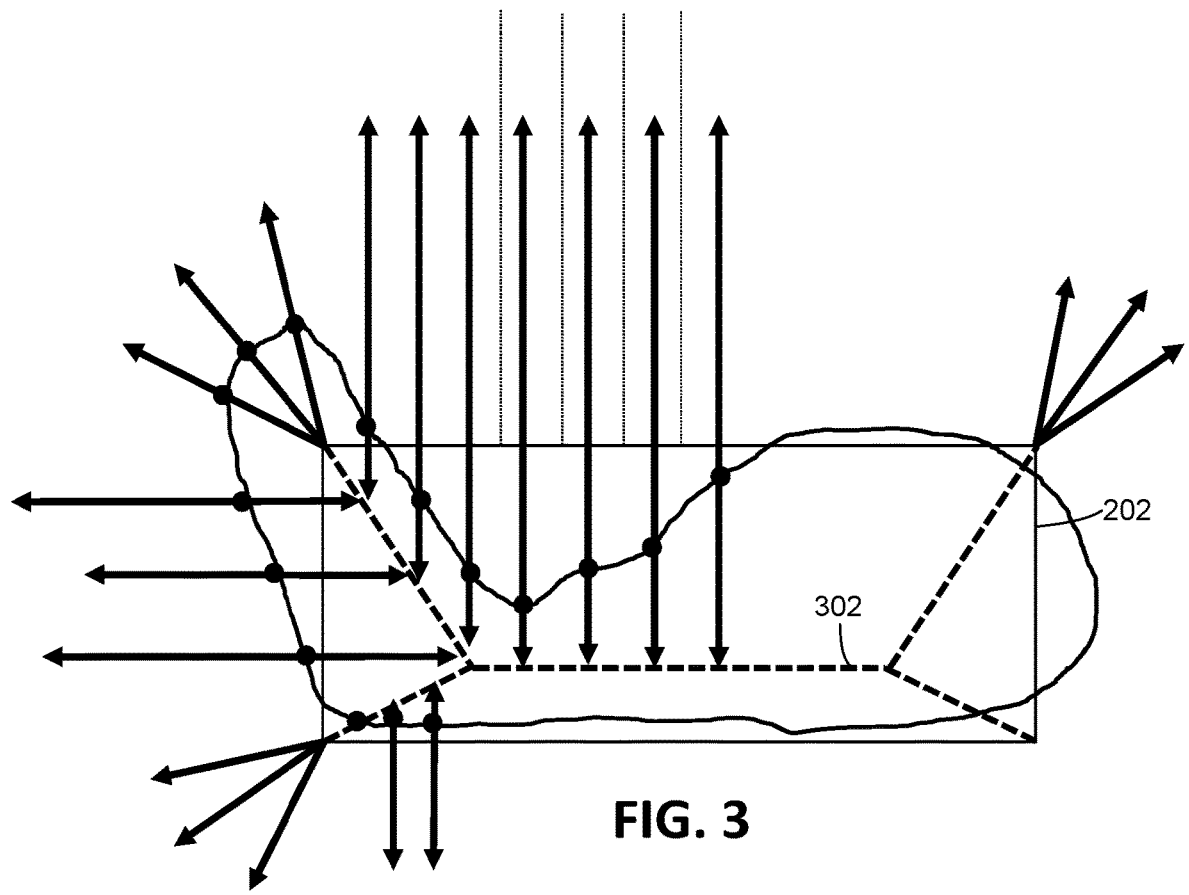
FIG. 3 shows a customized owned region boundary according to some examples of the present disclosure.

An owned region boundary may be user defined and customized. In some examples, an owned region boundary may also be generated between OPC iterations from an MAT of the current mask shape generated by the stitching procedure (described subsequently). FIG. 3 shows a customized owned region boundary 302 that is off center from the center of the polygon of the design target 202, as an example. This owned region boundary 302 allows for a mask to move beyond the center of the design polygon. Maintaining the topological connectivity of the customized owned region boundary 302 can be helpful for guaranteeing that rays from multiple segments and corners do not intersect. Topological connectivity generally refers to graph connectivity between non-order-2 nodes that have one, three, or more edges meeting at the respective node. It should be noted that the input design can be a previously corrected mask in which case the topological connectivity of the original design may be useful in constructing the customized ownership region.

Referring back to FIG. 1, at 110, for each ray, a distance is defined between the respective anchor point of the ray and an analysis point along the ray. The analysis point can differ based on implementation. In some implementations, such as in mask evolution where the anchor point is on an edge of the design target, the analysis point can be an intersection of a boundary of the mask and the ray. In some implementations, such as in retargeting where the anchor point is on a boundary of the mask, the analysis point can be an intersection of an edge of the design target and the ray. In these examples, the distance is defined between (i) an intersection of a boundary of the mask and the ray and (ii) an intersection of an edge of the design target and the ray. In any implementation, the mask shape can be initialized corresponding to the design target, e.g., by perturbing edges of the design target laterally outward some amount.

Continuing with the implementation illustrated in FIG. 2, intersections 222 represent respective intersections of a mask shape 230 with the rays 206. A distance (noted as d_i for subsequent description), which can be positive or negative, is generated for each ray 206 from the edge or corner of the design target 202 from which the respective ray 206 emanates to the intersection 222 on the respective ray 206, with a positive distance being outside of the design target 202 and a negative distance being inside the design target 202. An example positive distance 224 and an example negative distance 226 are illustrated. For a ray emanating from a convex corner, a negative distance d_i of the ray indicates that the ray degenerates, and the negative distance d_i is interior to the design target and is measured along the corresponding generalized ray. For a ray emanating from a concave corner, a positive distance d_i of the ray indicates that the ray degenerates, and the positive distance d_i is exterior to the design target and is measured along the corresponding generalized ray. A person having ordinary skill in the art will readily understand the distances for other rays 206.

Referring back to FIG. 2, a mask shape 230 is formed by connections between the intersections 222 of neighboring rays 206. This is called the stitched mask shape. The mask shape can be initialized to some shape as noted above, and various iterations of the analysis described herein can modify the mask shape.

Figure 4:
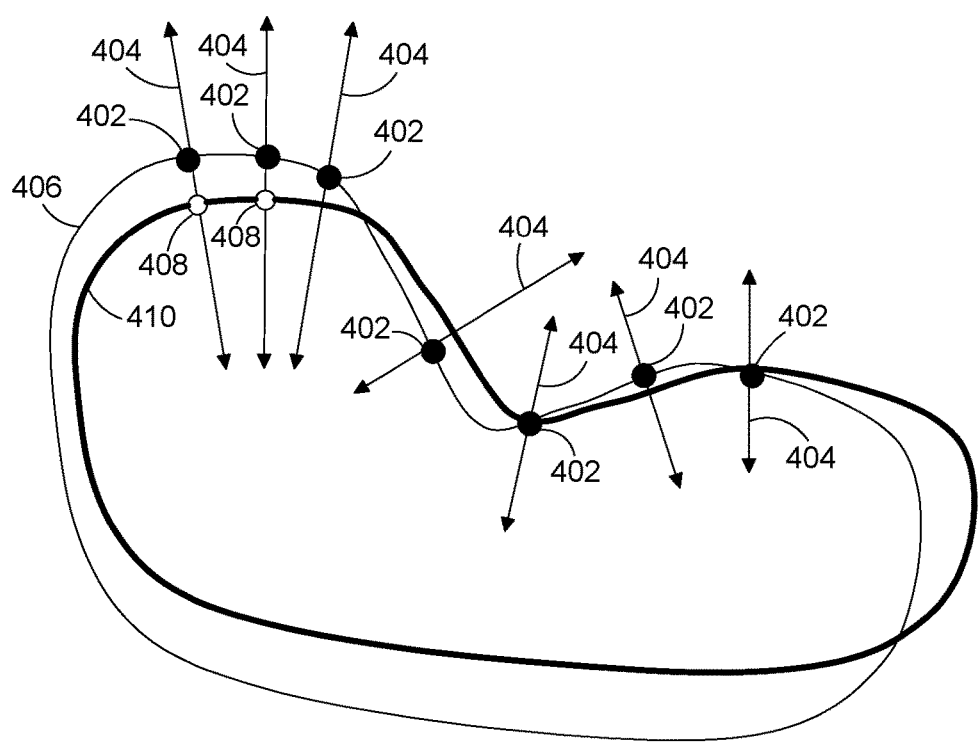
FIG. 4 shows rays emanating from anchor points on a mask according to some examples of the present disclosure.

While FIG. 2 illustrates rays emanating from anchor points on edges and corners of a design target, the rays may emanate from anchor points on a mask, as described. FIG. 4 illustrates a stitched mask 406 (e.g., corresponding to mask 230 shown in FIG. 2) and an initial mask 410. As shown in FIG. 4, rays 404 emanate from anchor points (e.g. anchor points 408) on the initial mask 410. Intersections 402 represent respective intersections of stitched mask 406 with the rays 404. The stitched mask 406 is formed by connections between the intersections 402 of neighboring rays 404.

Referring to FIG. 1, at 112, an analysis is performed, where the analysis is configured to perturb (e.g., modify) a mask shape based on the distances and corresponding errors. In some examples, the analysis (e.g., a mask evolution) can entail using an iterative algorithm to compute a movement of the intersection 222 or adjustment for each distance d_i along each ray 206. Such analysis could be performed using mask perturbations or lithographic cost function gradients, which may obtain an amount for any distance d_i to change to improve the lithography QOR. In some aspects, at 114, a mask design is generated for the mask that is to be used to fabricate the target shape on the image surface based on the modified distance.

The analysis can include obtaining an image contour based on the mask shape. The image contour can be obtained by simulating a lithography process, where the image contour is the shape of the feature patterned in a photosensitive material using the mask shape in the lithography process. For each ray, an error (noted as e_i for subsequent description) is obtained that is the distance between a target point associated with the ray and an intersection of the ray and the wafer image contour. Each target point can be associated with a ray and can be constructed independently from the rays. The target points can be placed to represent a boundary of an ideal wafer contour that meets a specification of the corresponding manufacturing process. Each ray can be associated with one target point or many target points, and/or each target point may be associated with one ray or many rays. A sensitivity (noted as s_i for subsequent description) to a change of the distance d_i can be determined for the ray, where the sensitivity s_i is a ratio of a change in the error e_i to the change of the distance d_i. The distance d_i can then be modified using this sensitivity s_i. Modifying a distance d_i perturbs the mask shape.

FIG. 2 further shows an image contour 250 and target points 252 that can be used in an OPC optimization algorithm. As shown, some of the targets 252 are on the target shape 202, and some of the target points are offset from the target shape 202. For example, some target points that are close to a corner of the target shape 202 may be offset since forming a feature with a sharp corner may not be possible (or at least difficult). The image contour 250 is a resulting feature or image simulated to be formed in a photosensitive material using the mask shape 230. FIG. 2 shows target points 252 that are constructed, and generally, each target point 252 is associated with a ray 206 closest to the target point 252 and/or on which the target point 252 is incident. The distance between the image contour 250 and a respective target point 252 associated with a respective ray 206 (e.g., an example distance 254 is illustrated) is the error e_i (e.g., a signed error) for each target point. If the distance is interior to the design target 202, the error is negative, and if the distance is exterior to the design target 202, the error is positive. A sensitivity s_i can be assigned based on previous iteration feedback of the mask impact to the contour image or other numerical differentiation techniques or set based on user knowledge or heuristics. Pseudo code for an example (where each ray has one associated target point) is below.

```
for each ray of index i
    d_i = distance for ray of index i
    e_i = error for target point of ray of index i
    s_i = Δe_i / Δd_i sensitivity of e_i to change in d_i
    d_i += Δe_i/s_i
```

There are also rule-based techniques to offset the design edges using geometric heuristics such as local width, spacing, polygon density, etc., to obtain a non-simulation-based mask synthesis methodology.

Figure 5:
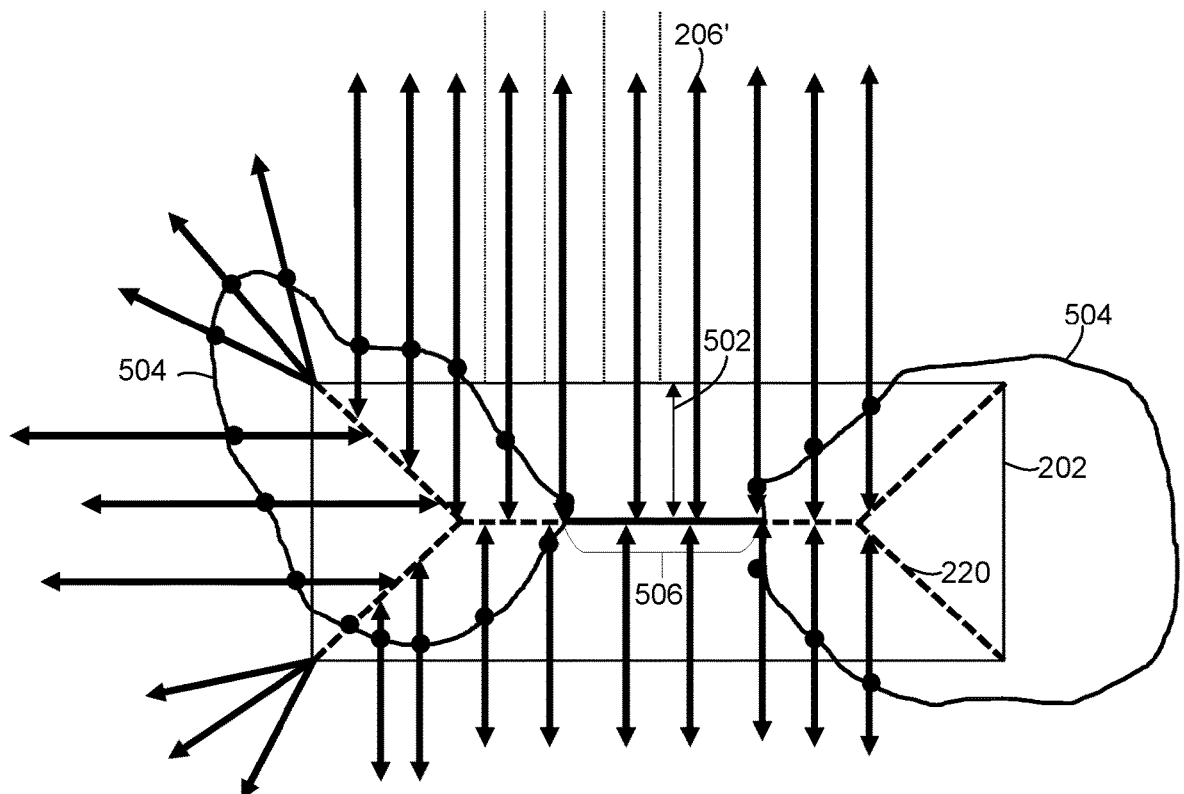
FIG. 5 depicts a layout to illustrate a negative distance for rays according to some examples of the present disclosure.
Figure 6:
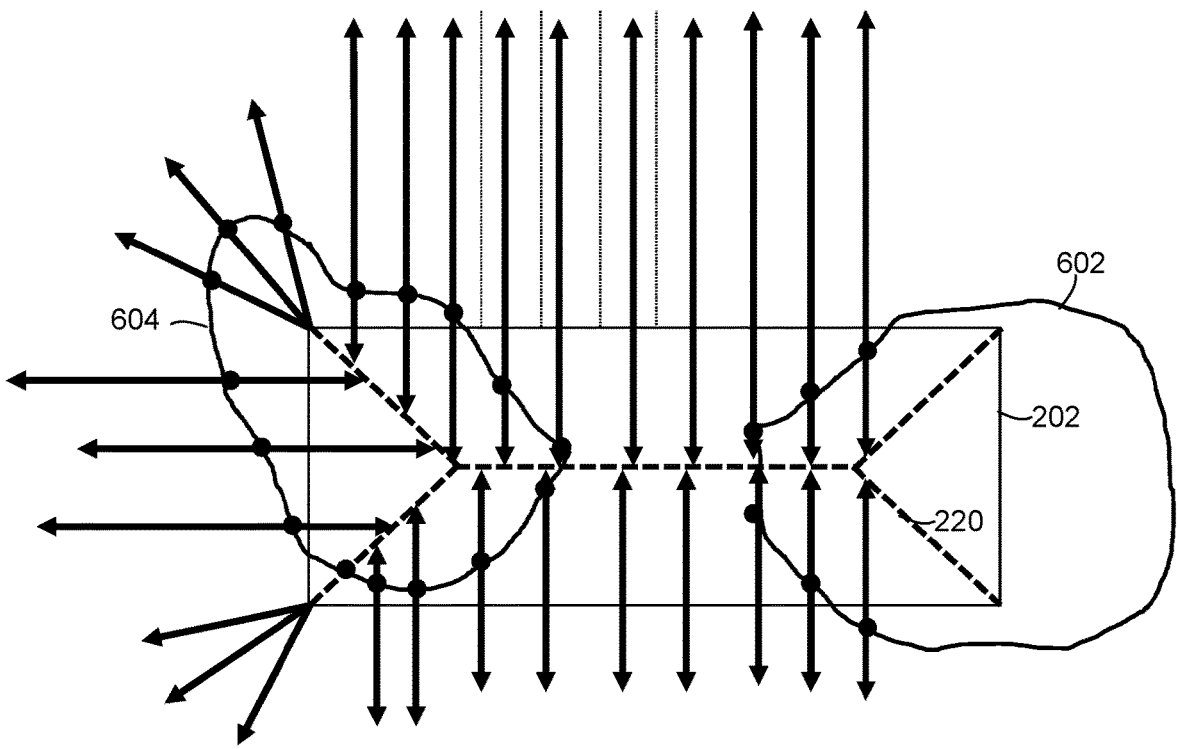
FIG. 6 depicts a layout to illustrate mask shapes formed after a degenerate portion of FIG. 5 is removed according to some examples of the present disclosure.

Under some circumstances, there may be one or more rays 206 that have a negative distance d_i that has a magnitude that is larger the corresponding distance from the edge of the design feature 202 to the owned region boundary 220. In this case, the connected mask shape can be constructed as to be coincident with the owned region boundary 220 for those rays. FIG. 5 shows an example of this where some of the rays 206 (e.g., ray 206') have a negative distance d_i (e.g., distance 502) such that a magnitude of the distance d_i is greater than or equal to the distance along the ray 206 from the edge of the design target 202 to the owned region boundary 220. As shown in FIG. 5, a mask 504 can have edges 506 coincident with a portion of the owned region boundary 220. FIG. 6 shows mask shapes 602, 604 after the degenerate portion (e.g., the edges 506 coincident with the owned region boundary 220) along the owned region boundary 220 is removed. For example, a mask design may be generated by modifying a mask shape such that the mask shape is formed into multiple non-overlapping mask shapes (e.g., mask shapes 602, 604) or such that one mask shape merges with another mask shape (e.g., mask shape 602 merges with mask shape 604).

Similarly, under some circumstances, two mask shapes could merge into one mask shape if the distance d_i of one or more rays 206 is equal to or greater than the distance along the corresponding ray 206 from the respective edge of the design target 202 to the space owned region boundary between different design targets.

Figure 7:
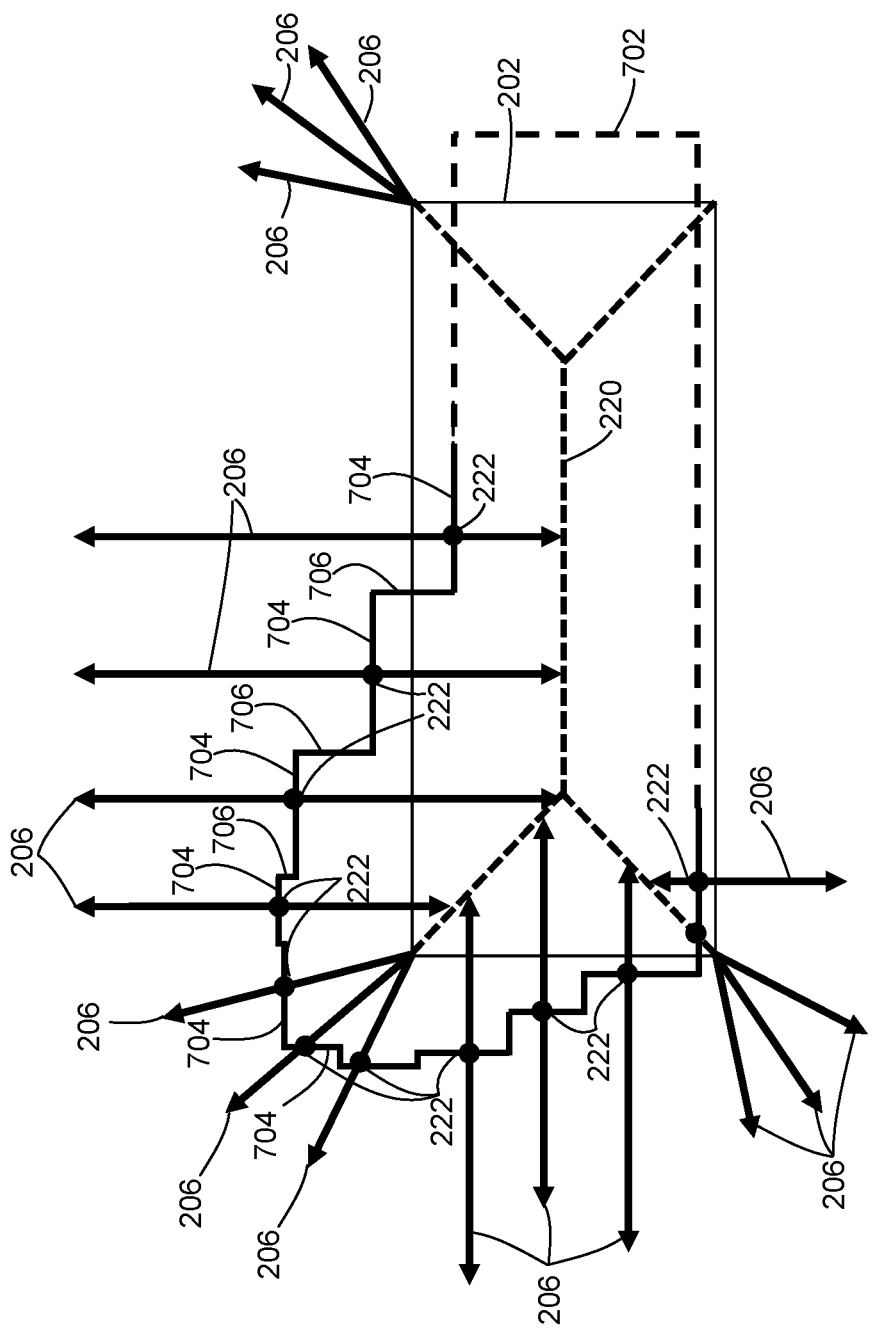
FIG. 7 depicts a layout to illustrate aspects of obtaining a mask shape having Manhattan and/or rectilinear edges according to some examples of the present disclosure.

In some examples, the connections between intersections 222 are Manhattan and/or rectilinear or have other geometric direction constraints. As shown in FIG. 7, a Manhattan mask 702 (a portion is shown) can be constructed. For a ray 206 emanating from an edge of the design target 202, a rectilinear segment 704 that is parallel to the respective edge of the design target 202 is used for forming the mask 702. A segment 704 is placed at the corresponding intersection 222 of the ray 206 and has a length corresponding to the length of the edge segment 204 of the design target 202 from which the ray 206 emanates.

For a ray 206 emanating from a corner of the design target 202, the segment 704 that is used for a ray 206 is parallel to the edge of the design target 202 that is connected to form the corner (from which the ray 206 emanates) and that forms a smallest angle with the respective ray 206. For a ray 206 that is a medial axis of an angle span 210, the segment 704 can be parallel to either edge of the design target 202 that is connected to form the corner. A segment 704 is placed at the corresponding intersection 222 of the ray 206 and has a length that is determined by the distance d_i of the ray 206. For example, the length of the segment 704 can be proportional to the distance d_i. The larger the distance d_i is, the larger the mask edge localized near the respective ray 206 can be.

Where neighboring segments 704 are parallel, the neighboring segments 704 are connected at neighboring ends of the neighboring segments 704 by a stitch segment 706 that is perpendicular to the neighboring segments 704. Where neighboring segments 704 are perpendicular (e.g., at a corner), the neighboring segments 704 are extended until the neighboring segments 704 intersect. When compared to conventional OPC mask creation methods, an advantage of this ray based approach can include a significant increase in the range of mask shapes that are possible to create while still maintaining a direct link between the degrees of freedom (the rays) and the design target.

A person having ordinary skill in the art will readily understand various data structures that may be implemented in the above process. For example, a class of mask objects can be defined for polygons and/or edges of polygons of a mask pattern. A class of a segment can be defined for segments 204. A class of a ray can be defined for rays 206. The class of a ray can include an anchor point, an intersection 222 and corresponding distance d_i (e.g., distance 224, 226), a target point 242 and corresponding error e_i (e.g., distance 254), etc. The above described methods and/or algorithms can operate on and/or with instances of such classes. Different data structures and/or modified data structures can be used in different examples.

FIG. 8 illustrates one or more owned region boundaries formed in a space between a design target and another one or more design targets. For instance, the owned region 808 is formed between design targets 802, 804, 806, as shown. Rays 810 emanate from the design targets 802, 804, 806 and stop at the owned region 808. In other words, the owned region 808 provides a boundary between design targets 802, 804, 806 at which rays 810 emanating from those design targets stop.

A person having ordinary skill in the art will readily understand various modifications to the logical and/or mathematical expressions of examples described herein. Other examples contemplate such modifications.

Figure 9:
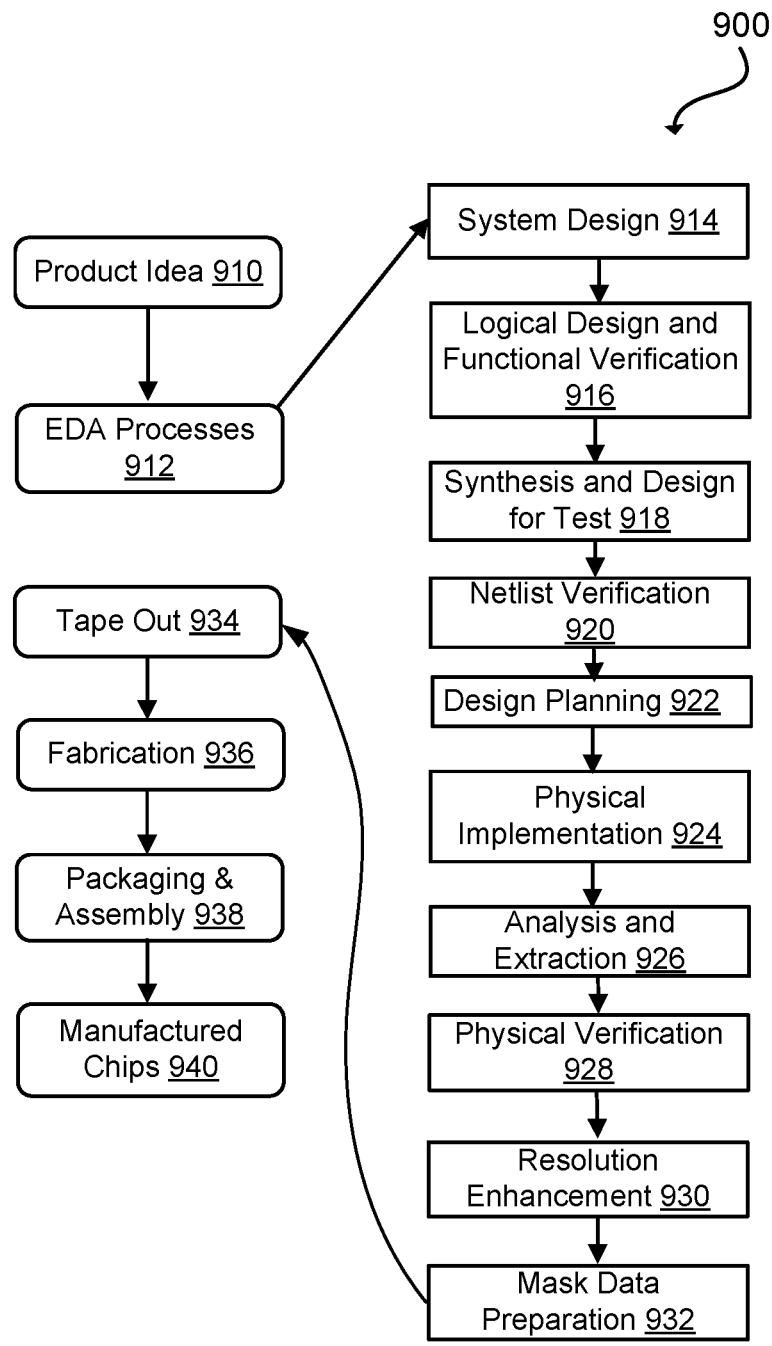
FIG. 9 depicts a flowchart of various processes used during the design and manufacture of an integrated circuit in accordance with some examples of the present disclosure.

FIG. 9 illustrates an example set of processes 900 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 910, with the creation of a product idea with information supplied by a designer, information that is transformed to create an integrated circuit that uses a set of EDA processes, at block 912. When the design is finalized, the design is taped-out, at block 934, which is when artwork (e.g., geometric patterns) for the integrated circuit is sent to a fabrication facility to manufacture the mask set, which is then used to manufacture the integrated circuit. After tape-out, at block 936, the integrated circuit is fabricated on a semiconductor die, and at block 938, packaging and assembly processes are performed to produce, at block 940, the finished integrated circuit (oftentimes, also referred to as "chip" or "integrated circuit chip").

Specifications for a circuit or electronic structure may range from low-level transistor material layouts to high-level description languages. A high-level of representation may be used to design circuits and systems, using a hardware description language (HDL) such as VHDL, Verilog, SystemVerilog, SystemC, MyHDL or OpenVera. The HDL description can be transformed to a logic-level register transfer level (RTL) description, a gate-level description, a layout-level description, or a mask-level description. Each lower representation level that is a more detailed description adds more useful detail into the design description, such as, for example, more details for the modules that include the description. The lower levels of representation that are more detailed descriptions can be generated by a computer, derived from a design library, or created by another design automation process. An example of a specification language at a lower level of detail language for specifying more detailed descriptions is SPICE, which is used for detailed descriptions of circuits with many analog components. Descriptions at each level of detail are enabled for use by the corresponding tools of that layer (e.g., a formal verification tool). A design process may use a sequence depicted in FIG. 9. The processes described may be enabled by EDA products (or tools).

During system design, at block 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 918, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 920, the netlist is checked for compliance with timing constraints and for correspondence with the HDL code. During design planning, at block 922, an overall floor plan for the integrated circuit is constructed and analyzed for timing and top-level routing.

During layout or physical implementation, at block 924, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 926, the circuit function is verified at the layout level, which permits refinement of the layout design. During physical verification, at block 928, the layout design is checked to ensure that manufacturing constraints are correct, such as design rule check (DRC) constraints, electrical constraints, lithographic constraints, and that circuitry function matches the HDL design specification. During resolution enhancement, at block 930, the geometry of the layout is transformed to improve how the circuit design is manufactured. The method 100 of FIG. 1 can be performed in block 930, for example.

During tape-out, data is created to be used (after lithographic enhancements are applied if appropriate) for production of lithography masks. During mask data preparation, at block 932, the tape-out data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
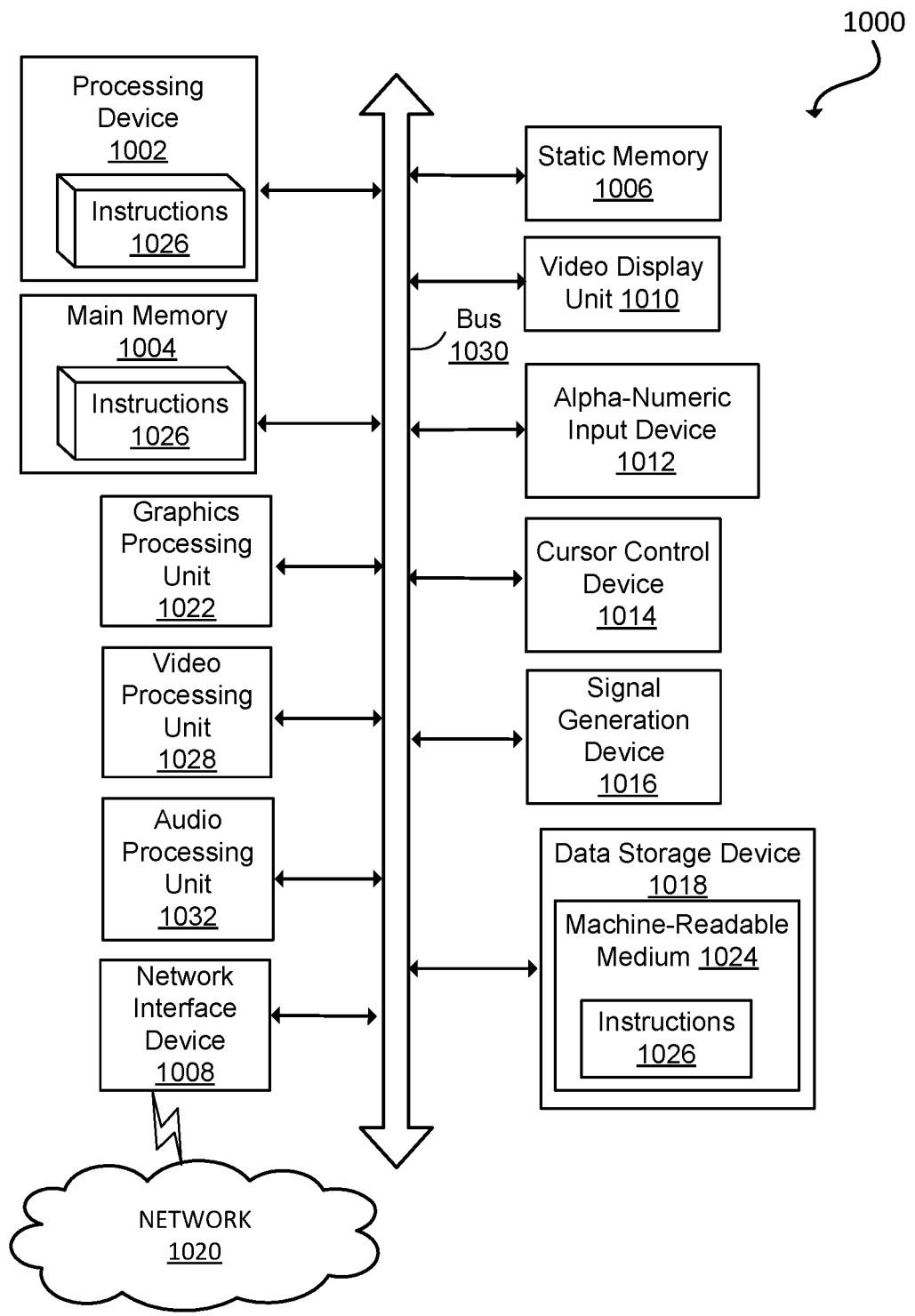
FIG. 10 depicts a diagram of an example computer system in which examples of the present disclosure may operate.

FIG. 10 illustrates an example of a computer system 1000 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030. The main memory 1004 includes or is a non-transitory computer readable medium. The main memory 1004 (e.g., a non-transitory computer readable medium) can store one or more sets of instructions 1026, that when executed by the processing device 1002, cause the processing device 1002 to perform some or all of the operations, steps, methods, and processes described herein.

Processing device 1002 represents one or more processors such as a microprocessor, a central processing unit, or the like. More particularly, the processing device 1002 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing some or all of the operations, steps, methods, and processes described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (e.g., a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also including machine-readable storage media.

In some implementations, the instructions 1026 include instructions to implement functionality described above. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 1002 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   obtaining a target shape on an image surface to be fabricated using a mask based on a design of an integrated circuit;
   generating rays emanating from respective anchor points, the anchor points being on a boundary of the target shape or a boundary of a mask shape of the mask;
   defining, for each ray of the rays, a distance between a first intersection of the respective ray and the boundary of the target shape and a second intersection of the respective ray and the boundary of the mask shape;

modifying, by one or more processors, the distance based on an error between the target shape and a resulting shape simulated to be on the image surface resulting from the mask shape; and generating a mask design for the mask that is to be used to fabricate the target shape on the image surface based on the modified distance.

2. The method of claim 1, further comprising generating an owned region boundary in the target shape, wherein the rays do not extend beyond the owned region boundary.

3. The method of claim 1, further comprising generating an owned region boundary in a space disposed between the target shape and one or more other target shapes, wherein the rays do not extend across the owned region boundary.

4. The method of claim 3, wherein the owned region boundary is generated using a medial axis transform of the target shape.

5. The method of claim 4, wherein the owned region is user defined.

6. The method of claim 3, wherein the mask shape comprises an edge that coincident with a portion of the owned region.

7. The method of claim 1, wherein generating the mask design comprises modifying the mask shape such that the mask shape is formed into multiple non-overlapping mask shapes or such that the mask shape merges with another mask shape.

8. The method of claim 1, wherein one or more of the rays emanate from a corner of the target shape or the mask shape.

9. The method of claim 8, wherein the one or more of the rays comprise a first ray, a second ray, and a third ray emanating from the corner, and wherein an angle between the first ray and the second ray is the same as an angle between the second ray and the third ray.

10. The method of claim 1, wherein modifying the distance between the target shape and the resulting shape is based on a rule table.

11. The method of claim 1, further comprising determining a sensitivity, the sensitivity representing a ratio of a change in the error to a change of the distance, wherein modifying the distance is based on the sensitivity.

12. The method of claim 1, wherein the masked shape comprises lines that are parallel with an edge of the target shape, each of the lines being through the second intersection of one of the rays and the masked shape.

13. The method of claim 12, wherein two of the lines are connected by another line that is perpendicular to the edge of the target shape.

14. An apparatus comprising:
a memory; and
one or more processors coupled to the memory, the memory and the one or more processors being configured to:
obtain a target shape on an image surface to be fabricated using a mask based on a design of an integrated circuit;
generate rays emanating from respective anchor points, the anchor points being on a boundary of the target shape or a boundary of a mask shape of the mask;
define, for each ray of the rays, a distance between
a first intersection of the respective ray and the boundary of the target shape and
a second intersection of the respective ray and the boundary of the mask shape; and
perform an analysis configured to modify the distance based on an error between the target shape and a resulting shape simulated to be on the image surface resulting from the mask shape.

15. The apparatus of claim 14, wherein the memory and the one or more processors are further configured to generate an owned region boundary in the target shape, wherein the rays do not extend beyond the owned region boundary.

16. The apparatus of claim 15, wherein the owned region boundary is generated using a medial axis transform of the target shape.

17. The apparatus of claim 16, wherein the owned region is user defined.

18. The apparatus of claim 15, wherein the mask shape comprises an edge that coincident with a portion of the owned region.

19. The apparatus of claim 14 wherein the memory and the one or more processors are further configured to generate an owned region boundary in a space disposed between the target shape and one or more other target shapes, wherein the rays do not extend across the owned region boundary.

20. A non-transitory computer-readable medium comprising executable instructions that, when executed by one or more processors of an apparatus, cause the apparatus to:
obtain a target shape on an image surface to be fabricated using a mask based on a design of an integrated circuit;
generate rays emanating from respective anchor points, the anchor points being on a boundary of the target shape or a boundary of a mask shape of the mask;
define, for each ray of the rays, a distance between
a first intersection of the respective ray and the boundary of the target shape and
a second intersection of the respective ray and the boundary of the mask shape; and
perform an analysis, by the one or more processors, configured to modify the distance based on an error between the target shape and a resulting shape simulated to be on the image surface resulting from the mask shape.

* * * * *